United States Patent
Presting et al.

(10) Patent No.: US 6,342,720 B1
(45) Date of Patent: Jan. 29, 2002

(54) VOLTAGE-CONTROLLED WAVELENGTH-SELECTIVE PHOTODETECTOR

(75) Inventors: Hartmut Presting, Blaustein (DE); Lorenzo Colace; Gianlorenzo Masini, both of Rome (IT); Thomas Pearsall, Mercer Island, WA (US)

(73) Assignee: DaimlerChrysler AG, Stuttgart (DE)

( * ) Notice: Subject to any disclaimer, the term of this patent is extended or adjusted under 35 U.S.C. 154(b) by 0 days.

(21) Appl. No.: 09/445,172
(22) PCT Filed: May 26, 1998
(86) PCT No.: PCT/EP98/03089
§ 371 Date: Apr. 3, 2000
§ 102(e) Date: Apr. 3, 2000
(87) PCT Pub. No.: WO98/56045
PCT Pub. Date: Dec. 10, 1998

(30) Foreign Application Priority Data

Jun. 3, 1997 (DE) .......................................... 197 23 177

(51) Int. Cl.$^7$ ...................... H01L 31/00; H01L 31/072; H01L 31/075
(52) U.S. Cl. ...................... 257/440; 257/21; 257/184; 257/449; 257/458
(58) Field of Search .......................... 257/21, 53, 184, 257/440, 458, 449

(56) References Cited

U.S. PATENT DOCUMENTS

| 4,633,287 A | 12/1986 | Yamazaki |
| 4,820,915 A | 4/1989 | Hamakama et al. |
| 5,311,047 A | 5/1994 | Chang |
| 5,329,136 A | * 7/1994 | Goossem ...................... 257/21 |
| 5,384,469 A | 1/1995 | Choi |
| 5,459,332 A | 10/1995 | Carruthers |
| 5,646,421 A | 7/1997 | Liu |
| 5,923,049 A | * 7/1999 | Bohm .......................... 257/449 |
| 6,148,015 A | * 11/2000 | Jacquet .......................... 257/21 |

FOREIGN PATENT DOCUMENTS

| DE | 197 14 054 | 10/1998 |
| EP | 0 682 375 | 11/1995 |
| WO | 96/13865 | 5/1996 |
| WO | 96/39719 | 12/1996 |
| WO | 97/17719 | 5/1997 |

OTHER PUBLICATIONS

J.M. Olson et al., "High Efficiency III–V Solar Cells", Compound Semiconductor, pp. 27–29, Nov./Dec. 1996.

(List continued on next page.)

Primary Examiner—Allan R. Wilson
(74) Attorney, Agent, or Firm—Kenyon & Kenyon

(57) ABSTRACT

A voltage-controlled, wavelenght-selective photodetector includes comprising a double diode having a counter-polarized Si-Schottky diode and a SiGe PIN diode. The short-wave portion ($\lambda < 0.9$ $\mu$m) of the light entering the detector through a window generates electron-hole pairs in the Si-Schottky diode, while the longer-wave portion (1 $\mu$m $< \lambda < 2$ $\mu$m) passes through the substrate and is absorbed in the epitaxially deposited SiGe superlattice or the quantum well diode. The photocurrents of both detectors flow in physically opposite directions and subtract from each other, resulting in a wavelength-dependent operational sign of the photocurrent. The level of the bias voltage applied determines whether the photocurrent of the Si-Schottky diode or the photocurrent of the Si/Ge PIN diode determines the spectrum. This can be used, for example, in an application for decoding signals by transforming the light signal into an electrical output signal and subtracting the photocurrents of the two detectors which filters out the noise component and thus raises the signal/noise ratio of a light signal.

9 Claims, 3 Drawing Sheets

OTHER PUBLICATIONS

H. Presting,"Ultrathin Sim Gen Strained Layer Superlattices—A Step Towards SI Optoelectronics", Semiconductor Science and Technology, vol. 7, No. 9, pp. 1127–1148 (Sep. 1992).*

Y.K. Fang et al., "A Vertical–Type a–Si: H Back–to–Back Schottky Diode for High–Speed Color Image Sensor", IEEE Electron Device Letters, vol. 12, No. 4, pp. 172–174 (Apr. 1, 1991).*

G. Masini et al., "Voltage tunable SiGe photodetector: A novel tool for crypted optical communications through wavelength mixing", Applied Physics Letters, vol. 70, No. 24, pp. 3194–3196 (Jun. 16, 1997).*

Tsai et al., "Amporphous SiC/Si three–color dector", Applied Physics Letters, 52(4), pp. 275–277 (Jan. 25, 1988).

* cited by examiner

VOLTAGE-CONTROLLED WAVELENGTH-SELECTIVE PHOTODETECTOR

FIELD OF THE INVENTION

The present invention relates to a voltage-controlled wavelength-selective photodetector and a method for it's use.

RELATED TECHNOLOGY

Voltage-controlled wavelength-selective photodetectors can be used in optoelectronic converters for signal processing and for logical switching networks.

The article by Friedmann et al. in Compound Semiconductor, p. 27, November/December 1996, and the article by Fang et al. in IEEE Electron Device Letters Vol. 12, No. 4, Apr. 1, 1991, pp. 172–174 describe the use of photodetectors for detection of light having different wavelengths. European Patent Application No. 682 375 A1 also describes a photodetector that makes it possible to detect light having different wavelengths in the visible range using two detectors that are arranged one on top of the other and that are sensitive to different wavelengths. In addition, in German Patent Application No. (AZ 197 14 054 A1), filed prior to the date of the present application, but published after that date, describes a photodetector which is made of at least two photodiodes of silicon/silicon-germanium (Si/SiGe) semiconductor material arranged one on top of the other. These detectors are used, for example, in solar cells with the purpose of generating as high a photoelectric current as possible by adding the charges produced in the individual detectors. The use of different semiconductor materials contributes to achieving a high degree of spectral sensitivity in addition to a high degree of efficiency. The individual photoelectric currents produced in the detectors always overlap additively. Thus, while the use of various photodetectors to detect light signals is customary, the method of processing signals by subtraction of the photoelectric currents is not.

In order to separate a useful signal S from noise N and to improve the signal/noise ratio (S/N), expensive and complex signal decoding arrangements involving a plurality of detectors, beam splitters, filters, and additional electronics, are used.

SUMMARY OF THE INVENTION

An object of the present invention is therefore to provide a cost-effective, monolithically highly integratable photodetector that opens up possibilities of signal conversion in a broad spectrum through wavelength selectivity and can be used, in particular, to improve the signal/noise ratio of an optical signal.

BRIEF DESCRIPTION OF THE DRAWINGS

The photodetector according to the present invention is made of a double diode composed of a Si Schottky diode and a SiGe PIN diode of opposite polarities. The short-wavelength component ($\lambda<0.9$ $\mu$m) of light entering through a window in the detector preferably produces electron-hole pairs in the Si Schottky detector, while the long-wavelength component ($1$ $\mu$m$<\lambda<2$ $\mu$m) passes through the substrate and is preferably absorbed in the epitaxially deposited SiGe superlattice or the quantum well diode. The photoelectric currents of the two detectors flow in physically opposite directions and are subtracted from one another, so that a photoelectric current with a plus or minus sign, depending on the wavelength, results. The bias voltage applied decides whether the spectrum is defined by the photoelectric signal of the Si Schottky diode or of the Si/Ge PIN diode.

The present invention is elucidated below with reference to with reference to the drawings, in which the FIG. 1 shows the design of a photodetector.

DETAILED DESCRIPTION

Figure 1:
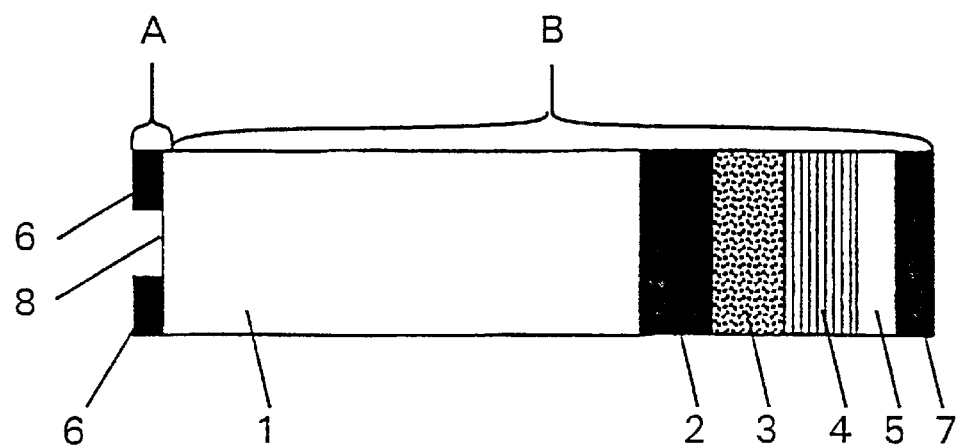

In the exemplary embodiment shown in FIG. 1, the layer structure illustrated is deposited on a slightly p-doped Si semiconductor substrate 1, for example, by molecular beam epitaxy. The layer structure contains a graduated SiGe buffer 2, having a thickness of approximately 650 nm, and a final Ge concentration of 60 atomic %, for example;

a constant SiGe buffer 3, having a thickness of approximately 500 nm, preferably with a final Ge concentration of graduated buffer 2 of 60 atomic %;

an n-doped SiGe superlattice 4 with a thickness of approximately 200 nm having a periodically repeating layer sequence of, for example, six Si monolayers and four Ge monolayers, having a dopant concentration (Sb) of $10^{17}$ per cm$^3$;

a highly n-doped ($10^{19}$ per cm$^3$) Si cover layer 5 having a thickness of approximately 2 nm.

The detector regions are insulated from the surrounding semiconductor material using the usual process steps of integrated semiconductor technology, for example, with silicon dioxide or groove etching. The metal plating, acting as a Schottky contact, of substrate-side first contact 6, including window 8, and of second metal contact 7, is also structured on the epitaxial layer using standard semiconductor technology. Second metal contact 7 forms an ohmic contact due to the high degree of doping of thin cover layer 5. In an alternative exemplary embodiment, the second detector is provided with an integrated resonator. In another exemplary embodiment, a Bragg reflector is positioned over the second detector.

Figure 2:
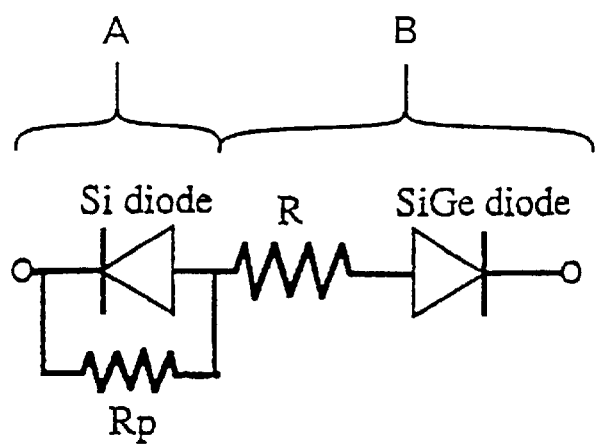
FIG. 2 shows an equivalent diagram of the dual diode of a photodetector.
Figure 3:
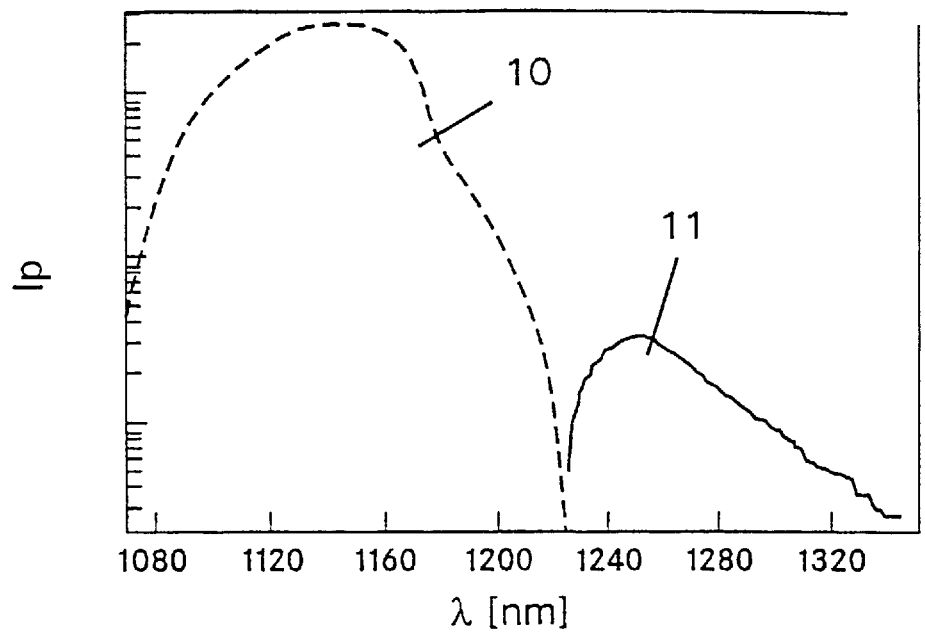
FIG. 3 shows the photoelectric current of a detector at a higher positive and negative bias voltage as a function of wavelength $\lambda$.

The equivalent diagram corresponding to the layer structure of dual diode A and B is shown in FIG. 2.

The mode of operation of the diodes having opposite polarities shows the curve of the photoelectric current as a function of the wavelength of the incident light. Depending on the bias voltage of the detector, either a photoelectric current 10 results from the silicon diode or a photoelectric current 11 results from the PIN SiGe diode in the event that the voltage is selected to be so high, for example, ±1 V, that one of the two diodes is always conductive and the other remains blocked.

Figure 4:
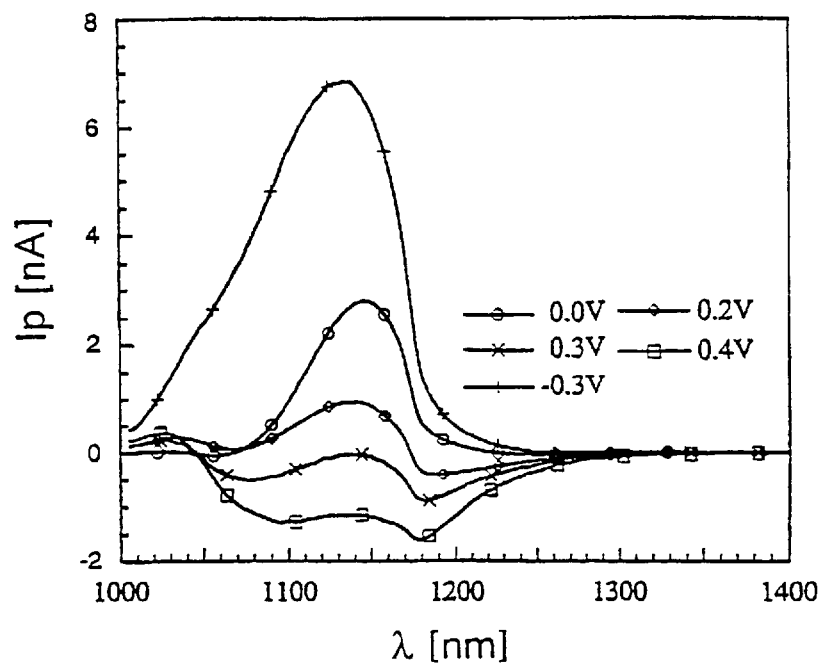
FIG. 4 shows the photoelectric current of a detector during operation at a lower bias voltage between $-0.3$ and $0.4$ V.

The dynamic response of the detector that is used in operation is set for bias voltages between plus and minus 1 V. The curves are shown in FIG. 4 for some intermediate values. For a suitably selected bias voltage, for example, 0.2 V, the curve has both positive and negative values depending on the wavelength. This can be used, for example, in an application for decoding signals as follows:

For an incident optical signal having two carrier frequencies $\lambda_1$ and $\lambda_2$, responsivity R of the detector is given by the equation $$R=A_1(S+N)+A_2N,$$

where $A_1$ and $A_2$ represent the voltage-dependent responsivity of the individual diodes for wavelengths $\lambda_1$ and $\lambda_2$, S represents the useful signal and N represents the noise. By applying a suitable bias voltage, the condition $A_1=-A_2$ can be fulfilled in that equalization is performed so that the photoelectric currents in both diodes have opposite signs, wherefrom $$R=A_1S$$

Figure 5:
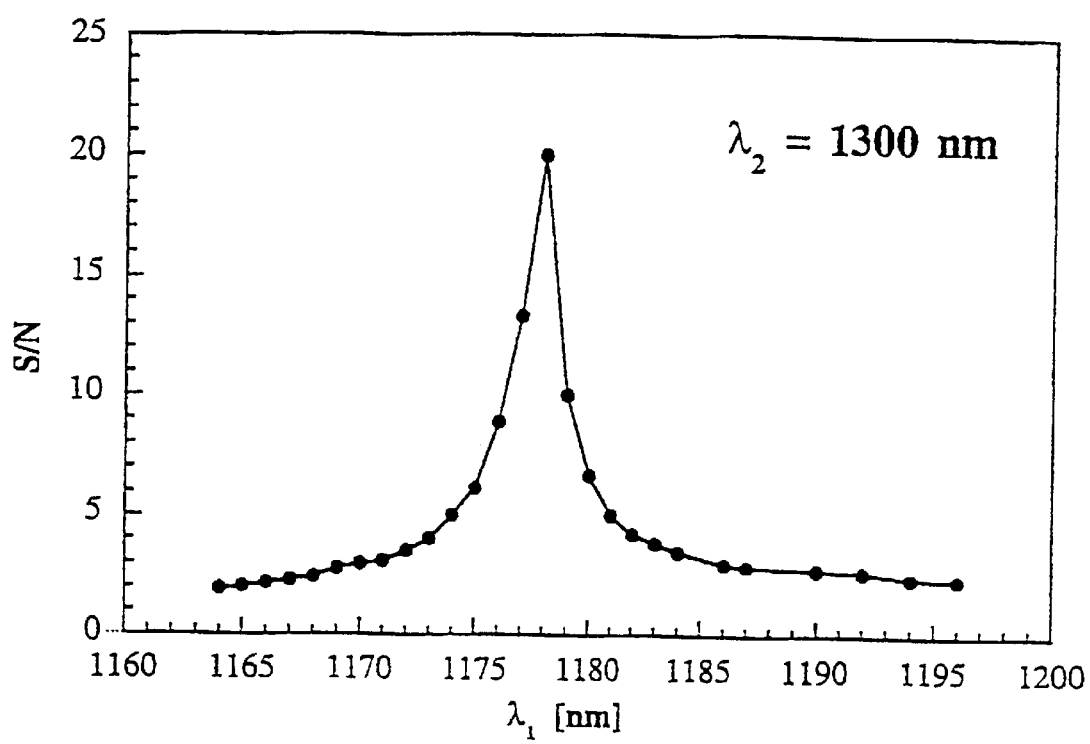
FIG. 5 shows the signal/noise ratio of a decoded signal.

Thus useful signal S can be separated from the noise level in a very simple manner. The signal/noise ratio (S/N) of a useful signal S, processed by decoding, is shown in FIG. 5. The curve shows in this example that this method considerably increases the signal/noise ratio by overlapping the signals in the range of the selected wavelengths $\lambda_1$ and $\lambda_2$.

What is claimed is:

1. A voltage-controlled wavelength-selective photodetector comprising:

a first detector including a Schottky diode, the first detector tuned to a first range of wavelengths, the first range of wavelengths including a noise component, the first detector having a first contact, the first contact being at a first potential; and a second detector including a Si/SiGe pn diode or a PIN diode, the second detector tuned to a second range of wavelengths, the second range of wavelengths different from the first range of wavelengths, the second range of wavelengths including a useful signal, the second detector having a second contact, the second contact being at a second potential, the first and second detectors being disposed one on top of the other, the first potential and the second potential defining a potential difference;

wherein a first photoelectric current induced in the first detector by incident light in the first range of wavelengths corresponding to the noise component is subtracted from a second photoelectric current induced in the second detector by incident light in the second range of wavelengths corresponding to the useful signal, thereby filtering out the noise component from the useful signal.

2. The voltage-controlled wavelength-selective photodetector as recited in claim 1 wherein the second detector further includes an integrated resonator.

3. The voltage-controlled wavelength-selective photodetector as recited in claim 1 further comprising a Bragg reflector disposed over the second detector.

4. The voltage-controlled wavelength-selective photodetector as recited in claim 1 wherein an active detector layer of the second detector includes a Si—Ge multilayer structure.

5. The voltage-controlled wavelength-selective photodetector as recited in claim 4 wherein the Si—Ge multilayer structure includes a Ge/SiGe quantum well potential.

6. The voltage-controlled wavelength-selective photodetector as recited in claim 4 wherein the Si—Ge multilayer structure includes a Si—Ge superlattice.

7. The voltage-controlled wavelength-selective photodetector as recited in claim 1 wherein the first detector includes a first contact layer, the first contact layer including at least one window for admitting light.

8. The voltage-controlled wavelength-selective photodetector as recited in claim 1 wherein the second detector includes a highly n-doped silicon layer and a second contact layer disposed on the highly n-doped silicon layer so as to form an ohmic contact.

9. A method of using a voltage-controlled wavelength-selective photodetector to improve a signal/noise ratio of a light signal, the voltage-controlled wavelength-selective photodetector including a first detector including a Schottky diode and a second detector including a Si/SiGe pn diode or a PIN diode, the first and second detectors being disposed one on top of the other and having opposite electric polarities and being sensitive to different ranges of wavelengths, the light signal including a first light component having a first wavelength which includes a noise component and a second light component having a second wavelength which includes a useful signal, the method comprising converting the light signal into an electric output signal;

applying a bias voltage between +1 V and −1 V to contacts of the first and second detectors; and selecting the bias voltage so that the noise component is capable of being filtered out by a subtraction of respective photoelectric currents of the first and second detectors.

* * * * *